(12) United States Patent
Nishiura

(10) Patent No.: US 7,072,180 B2
(45) Date of Patent: Jul. 4, 2006

(54) GAS COLLECTING DEVICE, TEST HEAD AND IC DEVICE TESTING APPARATUS

(75) Inventor: Koei Nishiura, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/974,724

(22) Filed: Oct. 28, 2004

(65) Prior Publication Data

US 2005/0056102 A1 Mar. 17, 2005

Related U.S. Application Data

(63) Continuation of application No. PCT/JP04/09374, filed on Jun. 25, 2004.

(30) Foreign Application Priority Data

Jun. 30, 2003 (JP) ........................ PCT/JP03/08299

(51) Int. Cl.
*H05K 7/20* (2006.01)

(52) U.S. Cl. ..................................................... 361/699
(58) Field of Classification Search ................. 361/699
See application file for complete search history.

(56) References Cited

U.S. PATENT DOCUMENTS

| | | | | |
|---|---|---|---|---|
| 1,849,196 A | * | 3/1932 | Meurk et al. ................. | 96/215 |
| 2,841,127 A | * | 7/1958 | Baster ........................ | 123/41.1 |
| 2,924,438 A | * | 2/1960 | Malkoff ....................... | 165/110 |
| 3,132,634 A | * | 5/1964 | Butler ......................... | 123/41.54 |
| 3,139,073 A | * | 6/1964 | White et al. ................ | 123/41.29 |
| 3,601,181 A | * | 8/1971 | Avrea ........................... | 165/51 |
| 3,939,901 A | * | 2/1976 | Cieszko et al. ............... | 165/51 |
| 3,989,103 A | * | 11/1976 | Cieszko et al. ............. | 165/110 |
| 4,006,775 A | * | 2/1977 | Avrea ........................... | 165/51 |
| 4,712,158 A | * | 12/1987 | Kikuchi et al. ............. | 361/699 |
| 4,712,609 A | * | 12/1987 | Iversen ....................... | 165/80.4 |
| 4,776,390 A | * | 10/1988 | Crofts ..................... | 165/104.32 |
| 4,781,247 A | * | 11/1988 | Schulz ..................... | 165/104.32 |
| 4,785,874 A | * | 11/1988 | Avrea ..................... | 165/104.32 |
| 4,892,140 A | * | 1/1990 | Honovich ..................... | 165/110 |
| 5,587,880 A | * | 12/1996 | Phillips et al. ............. | 361/687 |
| 5,810,074 A | * | 9/1998 | Hancock ..................... | 165/112 |
| 6,019,171 A | * | 2/2000 | Johnson ..................... | 165/174 |
| 6,065,208 A | * | 5/2000 | Lamb et al. ............. | 29/890.03 |
| 6,067,712 A | * | 5/2000 | Randlett et al. ........ | 29/890.053 |
| 6,079,481 A | * | 6/2000 | Lowenstein et al. .......... | 165/10 |
| 6,135,067 A | * | 10/2000 | Klamm et al. ........... | 123/41.54 |
| 6,421,240 B1 | * | 7/2002 | Patel .......................... | 361/699 |
| 6,568,466 B1 | * | 5/2003 | Lowenstein et al. ........ | 165/153 |
| 6,587,343 B1 | * | 7/2003 | Novotny et al. ............ | 361/698 |
| 6,708,653 B1 | * | 3/2004 | Lefrançois et al. ........ | 23/41.54 |

\* cited by examiner

*Primary Examiner*—Hezron Williams
*Assistant Examiner*—John Fitzgerald
(74) *Attorney, Agent, or Firm*—Posz Law Group, PLC

(57) ABSTRACT

A heating element cooling cover 5 for covering IC devices 44 mounted on a substrate 4, wherein a coolant is circulated to be able to contact the IC devices 44, and a groove 54 (bypath) is provided for an air and the coolant to flow from a gas accumulation part where gas accumulation is liable to be generated inside the heat element cooling cover 5 to a position where the circulating coolant comes downstream of the gas accumulation portion, so that gas accumulation can be effectively removed as a result that the air in the gas accumulation part can pass through the bypath.

8 Claims, 7 Drawing Sheets

(a)

(b)

(a)

(b)

GAS COLLECTING DEVICE, TEST HEAD AND IC DEVICE TESTING APPARATUS

This is a Continuation of Application No. PCT/JP04/09374, filed Jun. 25, 2004.

BACKGROUND OF THE INVENTION

1. Field of the Invention

The present invention relates to a gas collecting device capable of collecting a gas existing in an inner space of a coolant container for containing and cooling a heating element, and a test head and an IC device testing apparatus provided with the gas collecting device.

2. Description of the Related Art

Some elements composing an electric circuit are those which generate heat (heating elements) due to their operations, such as an IC device. Particularly in recent years, along with an operation speed getting higher and an integrated circuit getting highly densified, a heat value of an IC device has increased and demands for effectively cooling the IC device have become stronger. For example, in an LSI device mount device wherein a large number of LSI are modularized and mounted on one or both surfaces of a print substrate, the LSI device on the substrate generating heat due to its operation has to be cooled.

Therefore, a heating element mount device has been developed, wherein a plurality of heating elements mounted on a substrate are covered with a sealing case and a coolant circulates by a predetermined route in the sealing case (for example, the Japanese Unexamined Patent Publication No. 10-51169 and the Japanese Unexamined Patent Publication No. 10-303586).

In such a heating element mount device, when gas accumulation generates in the coolant route, heating elements in that part cannot be cooled. Therefore, to prevent generation of gas accumulation, it is general that a coolant inlet portion is provided at a lower portion of the sealed case and a coolant outlet portion is provided at an upper portion of the sealed case to flow the coolant from the bottom to top and an air existing in the coolant route is discharged with the coolant by utilizing own buoyancy.

However, even after a certain time from start of coolant circulation, an air or bubble may remain in a narrow part of an electric component and substrate. For example, an air or bubble tends to remain in a narrowly pitched IC lead part and a space between an electric component and a substrate, etc. In this case, it takes a long time to discharge the air or bubble to a degree that a test can be conducted. Also, since there are varying factors, such as a heating condition of the heating element, etc. other than a flow rate, temperature and viscosity of the coolant, the gas accumulation that an air or bubble stay may be hard to be eliminated in some cases even when partition walls are suitably designed.

IC devices adjacent to a gas accumulation as above is under a different cooling condition from a predetermined condition and the internal temperature changes, so that a signal propagation delay amount of the IC internal circuit changes along with the change of the internal temperature. As a result, in a system requiring timing accuracy of a testing apparatus, particularly in an IC device testing apparatus, there arises a problem that timing accuracy becomes deteriorated or unstable.

SUMMARY OF THE INVENTION

An object of the present invention is to provide a gas collecting device, a test head and an IC device testing apparatus capable of effectively removing gas accumulation.

To attain the above object, there is provided a gas collecting device provided with a coolant container for containing a coolant and circulating the coolant to make it contact an heating element, for collecting a gas existing in an internal space of the coolant container, comprising a gas collecting mechanism for drawing the gas existing in the internal space of the coolant container to discharge to outside of the coolant container (an invention 1).

According to the above invention (the invention 1), an air existing in an internal space of the coolant container is discharged to the outside of the coolant container by the collecting mechanism, therefore, even when air accumulation is generated in the coolant container, the air accumulation can be removed effectively.

As a result that air accumulation can be accurately eliminated as above, for example in an IC device testing apparatus using the present gas collecting device, a signal propagation delay amount of an internal circuit of the IC device can be maintained to be under a constant condition and timing accuracy of the testing device can be improved. Accordingly, test quality on timing accuracy, etc. of the IC device to be tested can be improved.

In the above invention (the invention 1), preferably, the gas collecting mechanism is provided with a drawing path; one end of the drawing path opens at a gas accumulation part generated in the internal space of the coolant container; and the other end of the drawing path opens at a discharge portion of the coolant in the coolant container (an invention 2).

According to the above invention (the invention 2), an air existing in the internal space of the coolant container can be discharged from the coolant container with the coolant through the drawing path.

In the above invention (the invention 2), the drawing path may be a tube-shaped bypath tube (an invention 3) or may be a bypath formed to be a groove shape on the coolant container (an invention 4).

The tube-shaped bypath may be provided inside the heating element cooling cover or may be outside of the heating element cooling cover. Also, the above groove-shaped bypath may be provided on the heating element cooling cover itself, for example, on a joint portion with other member (the substrate, etc.) of the heating element cooling cover. In this case, the groove becomes a tube shape as a result that the heating element cooling cover is put together with the other member.

In the above invention (the invention 2), in the case where the coolant container is arranged to be in a plurality of directions, and positions of the gas accumulation part move along with the plurality of directions, the drawing paths are preferably arranged corresponding to respective positions of the moving gas accumulation part (an invention 5).

According to the above invention (the invention 5), since even in the case where the coolant container or an apparatus provided with the coolant container is placed in any direction, gas accumulation can be removed. Therefore, the degree of freedom of designing the apparatus can be improved.

In the above invention (the invention 2), preferably, the coolant container is provided with an inlet for flowing in the coolant and an outlet for flowing out the coolant; and the other end of the drawing path opens near the outlet (an invention 6).

In the above invention (the invention 6), preferably, the other end of the drawing path opens at a part with a high flow rate of the coolant at the outlet (an invention 7).

As a result that the drawing path opens at a part with a high flow rate, a pressure at the other end portion of the drawing path becomes lower than that at the air accumulation part and an air remained at the air accumulation part can be discharged from the gas accumulation part through the drawing path due to the pressure difference.

Note that the present invention is not limited to the above and, for example, the other end of the drawing path may open at a downstream part of an air accumulation part. When the flow rate of the coolant at downstream of the air accumulation part is not higher than that at the air accumulation part, a pressure of the coolant flowing downstream of the air accumulation part is lower than that of the coolant flowing near the air accumulation part due to a pressure drop caused by a flow of the coolant. Therefore, an air staying at the air accumulation part can be discharged from the air accumulation part through the drawing path due to the pressure difference.

In the above invention (the invention 1), the heating elements are a plurality of heating elements mounted on a substrate; and the coolant container is a heating element cooling cover attached in an airtight way to one surface or both surfaces of the substrate to cover the heating elements (an invention 8).

Here, the "heating element" means those generate heat among elements composing an electric circuit and a kind thereof is not particularly limited. As a specific example of the heating element, an IC device, etc. may be mentioned.

The heating element is mounted on a substrate (for example, a print substrate and a ceramic substrate, etc.) with other elements composing an electric circuit, but not all elements composing the electric circuit are necessarily mounted on the substrate.

Note that it is assumed that when the heating element, such as an IC device, is connected to an endoergic/exoergic member, the member is also included in the "heating element".

Also, the "heating element cooling cover" is a cover capable of circulating a coolant therein by being attached to a substrate or by itself and also includes a concept of a case. When it is a case, the shape may be made to include the whole substrate.

The heating element cooling cover may be attached to one surface or both surfaces of a substrate depending on whether heat elements are mounted on one surface or both surfaces of the substrate.

In the above invention (the invention 1), preferably, a plurality of the heating elements are arranged on the substrate; the coolant container is provided with partition walls; and the partition walls are provided to form a flow route for the coolant to flow corresponding to an arrangement of the plurality of heating elements (an invention 9).

Secondary, the present invention provides a test head having a configuration of circulating the coolant to make it contact the heating elements mounted on the substrate, comprising the above gas collecting device (the inventions 1 to 9) (an invention 10).

Thirdly, the present invention provides an IC device testing apparatus having the configuration of circulating the coolant to make it contact the heating elements mounted on the substrate, comprising the gas collecting device (the inventions 1 to 9) (an invention 11).

BRIEF DESCRIPTION OF DRAWINGS

These and other objects and features of the present invention will become clearer from the following description of the preferred embodiments given with reference to the attached drawings, in which:

FIG. 4A to FIG. 4C are sectional views of a cover and a substrate according to an embodiment of the present invention, wherein FIG. 4A is a sectional view along the line A—A in FIG. 3 and FIG. 4C, and FIG. 4B is a sectional view along the line B—B in FIG. 4A, and FIG. 4C is a sectional view along the line C—C in FIG. 4A;

FIG. 5A and FIG. 5B are views of a bypath in the cover according to the same embodiment, wherein FIG. 5A is a view from the back of a part of the cover, and FIG. 5B is a sectional view of a part of the-cover (a sectional view along the line D—D in FIG. 4C);

FIG. 6A and FIG. 6B are views showing a cover and a substrate according to another embodiment of the present invention, wherein FIG. 6A is a sectional view, and FIG. 6B is a view from the front; and FIG. 7A and FIG. 7B are views of end portions of the bypath in the cover according to the same embodiment, wherein FIG. 7A is a sectional view near the base end portion of the bypath, and FIG. 7B is a sectional view of a terminal end portion of the bypath.

DESCRIPTION OF THE PREFERRED EMBODIMENT

First Embodiment

Below, a first embodiment of the present invention will be explained based on the drawings.

Figure 1:
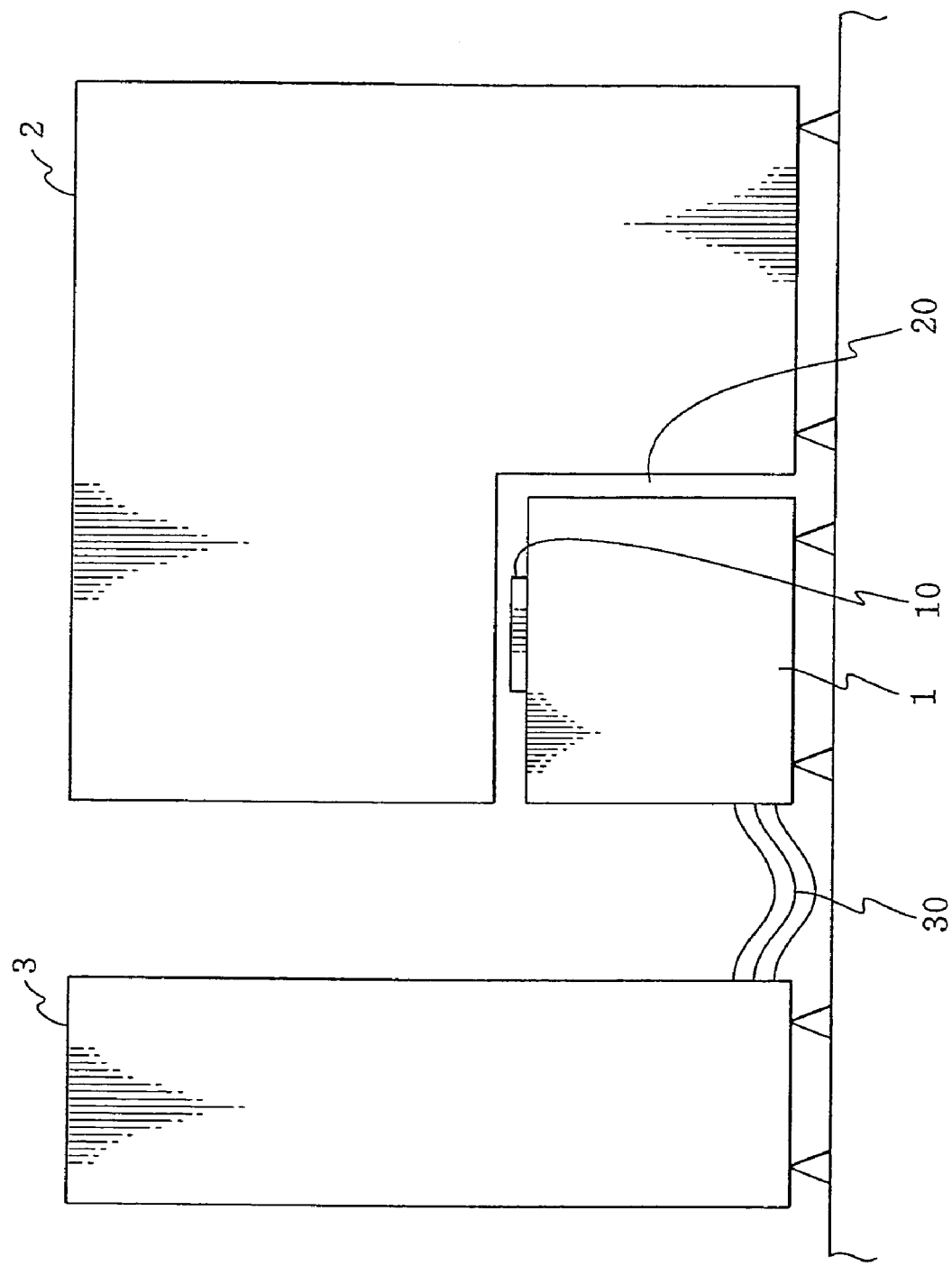
FIG. 1 is an overall view from the side of an IC device testing apparatus comprising a test head according to an embodiment of the present invention.

As shown in FIG. 1, a test head 1 according to the present embodiment is arranged in an exchangeable way in a space portion 20 provided below a handler 2 and electrically connected to a tester body 3 via a cable 30.

Figure 2:
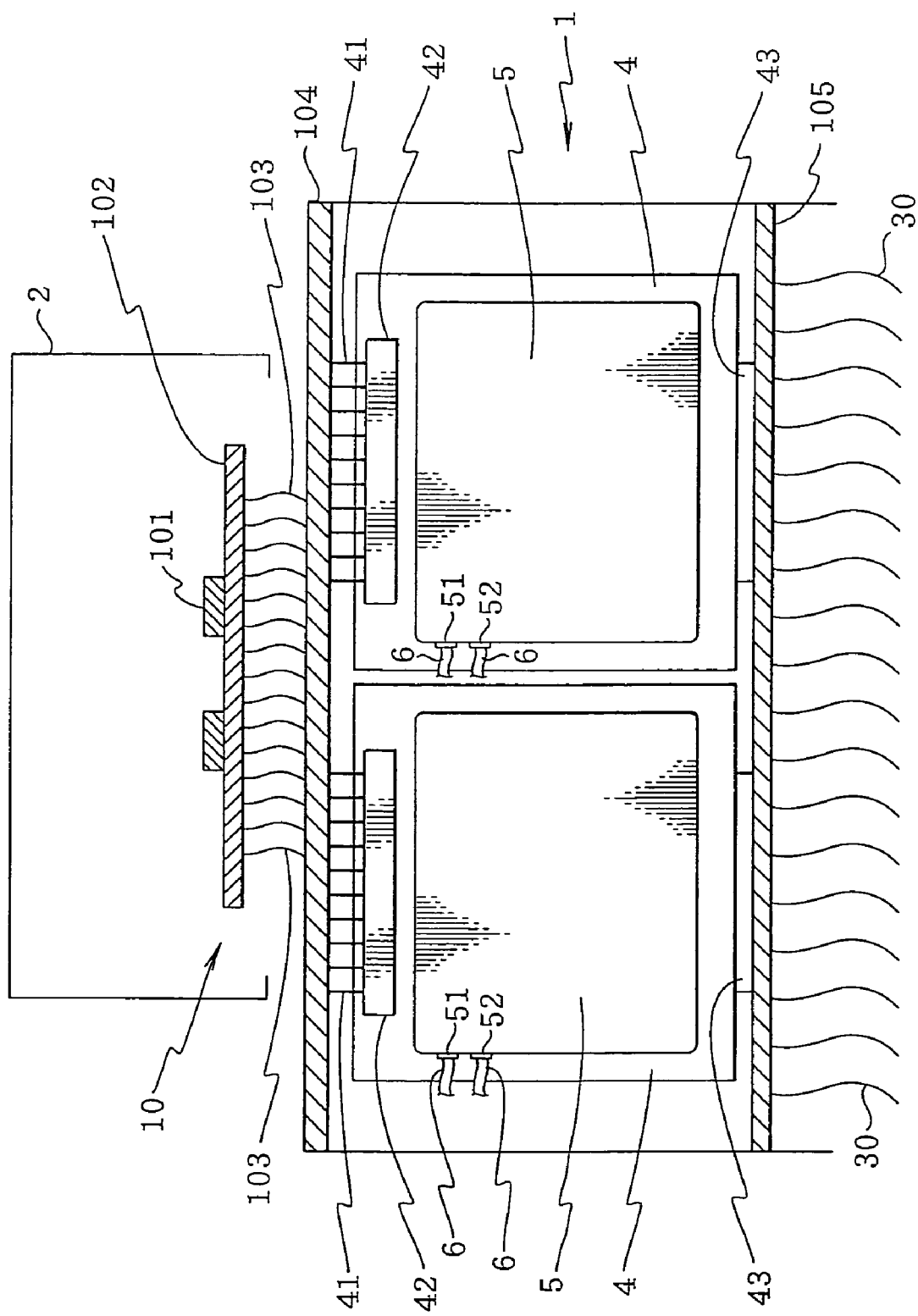
FIG. 2 is a sectional view from the front showing an outline of the configuration of the test head according to the same embodiment.
Figure 3:
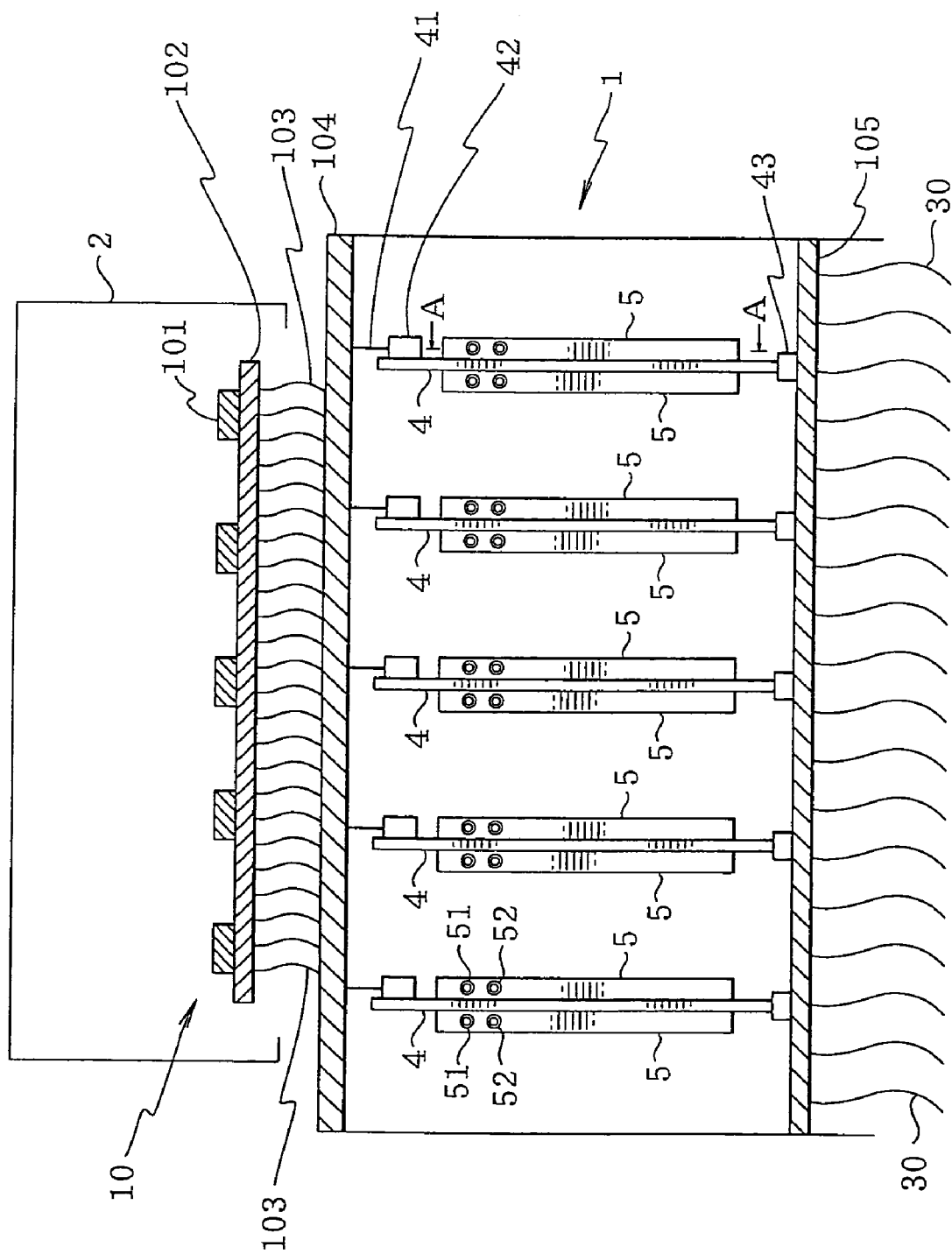
FIG. 3 is a sectional view from the side showing an outline of the configuration of the test head according to the same embodiment.

As shown in FIG. 2 and FIG. 3, a contact portion 10 is provided on top of the test head 1, and IC devices to be tested are mounted on sockets 101 of the contact portion 10 through an opening formed on the handler 2 and subjected to a test.

The handler 2 successively conveys pre-test IC devices to the contact portion 10 of the test head 1, presses the conveyed IC devices against the sockets 101 of the contact portion 10 and, after a test of the IC device is conducted by a signal from the tester body 3 via the test head and the cable 30, sorts and stores the post-test IC devices in accordance with the test results. The configuration of the handler 2 is not particularly limited.

As the handler 2, well known handlers can be used, for example, a heat plate type handler comprising a conveyor for conveying respective IC devices, a heat plate for applying high temperature thermal stress to the IC devices, a supply tray, classification tray and other predetermined trays; and a chamber type handler comprising a storage section for storing customer trays loaded with pre-test and post-test IC devices, a loader section for reloading the IC devices loaded on the customer tray to a test tray and sending the IC devices loaded on the test tray to the chamber portion, a chamber section for conducting a test by applying predetermined thermal stress to the IC devices, and an unloader section for taking out the post-test IC devices from the chamber section, classifying and storing the same; etc.

The contact portion 10 of the test head 1 comprises, as shown in FIG. 2 and FIG. 3, sockets 101, a socket board 102 attached with the sockets 101 on its upper surface, and a performance board 104 arranged below the socket board 102 and electrically connected to the socket board 102 via a cable 103.

The sockets 101 are loaded with IC devices to be tested in a detachable way, the IC devices to be tested loaded on the sockets 101 are applied a test electric signal from the tester body 3, and responding signals in response thereto read from the IC devices to be tested are sent to the tester body 3, consequently, performance and functions, etc. of the IC devices to be tested are tested.

A plurality of substrates 4 (print substrates, pin cards) are provided inside the test head 1, and the performance board 104 is electrically connected to the substrates 4.

In the present embodiment, a pin holder 42 for holding a plurality of spring probe pins 41 is provided at an upper end portion of the substrate 4 as shown in FIG. 2 and FIG. 3, as a result that the spring probe pins 41 contact pads provided on the lower surface of the performance board 104, the substrate 4 and the performance board 104 are electrically connected. Note that a method of connecting the substrate 4 and the performance board 104 is not limited to this and it may be, for example, any connecting method using a cable and connector, etc.

On the other hand, a connector 43 is provided at a lower end portion of the substrate 4 and the connector 43 is attached to a back board 105 positioned on the bottom of the test head 1. The substrate 4 is electrically connected to the tester body 3 via the connector 43, the back board 105 and the cable 30 extending to outside of the test head 1. As explained above, the contact portion 10 of the test head 1 is electrically connected to the tester body 3 via the substrate 4.

Note that the configuration of the test head 1 is not limited to the example shown in FIG. 2 and FIG. 3 and may be suitably modified within the range where an electric signal for testing IC devices can be input to and output from the IC devices mounted on the sockets 101. For example, in the present embodiment, the substrates 4 are provided perpendicularly to the back board 105, but they may be provided in parallel with the back board 105. Also, in the present embodiment, the substrates 4 by the number of 2 by 5 corresponding to the sockets by the number of 2 by 5 are contained in the test head 1, but the number of substrates 4, is not particularly limited and-may be suitably determined in accordance with the number, etc. of the sockets 101.

Figure 4:
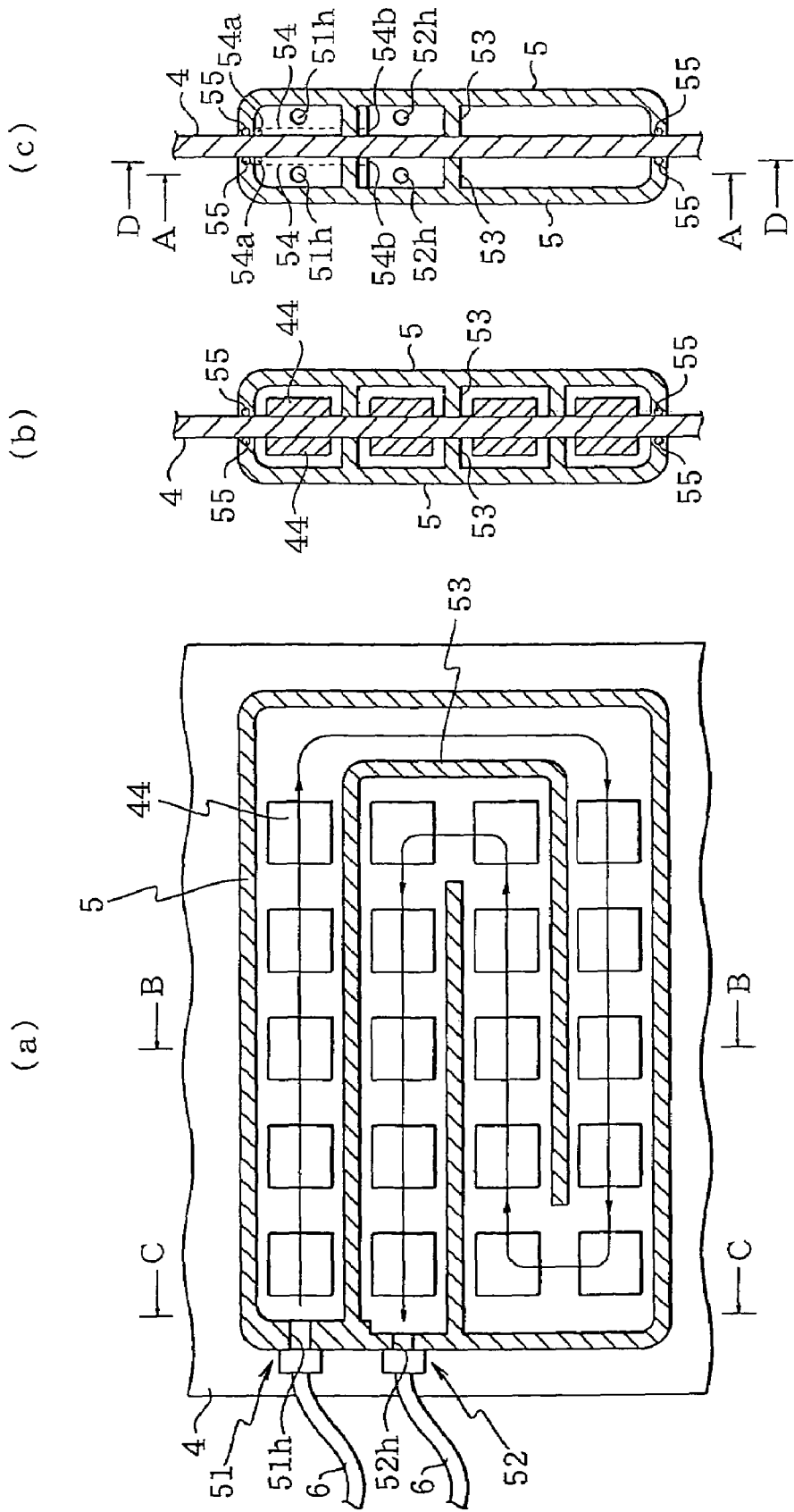

As shown in FIG. 4A and FIG. 4B, a plurality of IC devices 44 are mounted in matrix in the directions to the right, left, top and bottom on both surfaces of the substrate 4. In the present embodiment, IC devices 44 by the number of 5 by 4 are mounted on each surface of the substrate 4, but the number of the IC devices 44 is not particularly limited. The IC devices 44 are heating elements which operate and generate heat when testing the IC devices to be tested mounted on the sockets 101.

Figure 5:
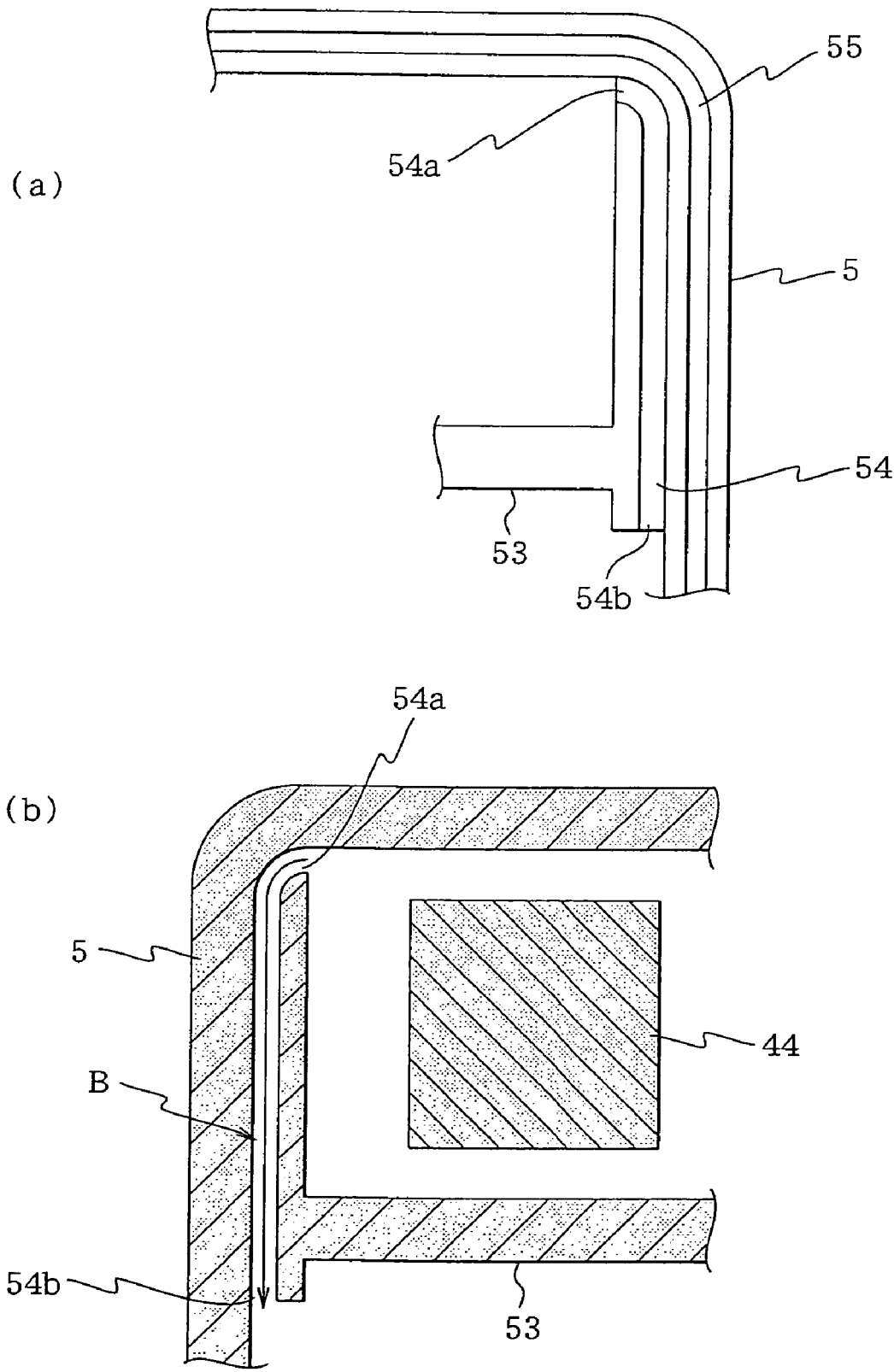

On both surfaces of the substrate 4, a cover 5 for covering all IC devices 44 mounted on one surface of the substrate 4 is attached. As shown in FIG. 4B, FIG. 4C and FIG. 5A, seal members 55 are provided to the cover 5 at joint portions with the substrate 4, and the cover 5 is tightly sealed on the substrate 4 by the seal members 55.

On one side wall portion of the cover 5, a coolant inlet portion 51 and a coolant outlet portion 52 are provided and they are connected to conduits 6, respectively. The conduits 6 are connected to a coolant circulator (not shown) capable of circulating and cooling the coolant, and the coolant can circulate through the conduits 6 and inside the cover 5 due to the coolant circulator.

As shown in FIG. 4A and FIG. 4C, a hole as a coolant inlet 51h is formed on the coolant inlet portion 51 of the cover 5, and a hole as a coolant outlet 52h is formed on the coolant outlet portion 52. Also, inside the cover 5, partition walls 53 as shown in FIG. 4A are formed and a flow route of the coolant is decided by the partition walls 53.

In the present embodiment, as indicated by an arrow in FIG. 4A, the coolant entering from the coolant inlet 51h moves in the horizontal direction (in the right direction in FIG. 4A) to cool IC devices 44 on the uppermost line (the first line), moves downward in the vertical direction to the lowermost line, moves in the horizontal direction (in the left direction in FIG. 4A) to cool IC devices 44 on the lowermost line (the fourth line), then, the coolant moves upward by one line in the vertical direction, and moves in the horizontal direction (in the right direction in FIG. 4A) to cool IC devices 44 on the third line. Then, the coolant moves upward by one line in the vertical direction, moves in the horizontal direction (in the left direction in FIG. 4A) to cool IC devices 44 on the second line, and finally flows out from the coolant outlet 52h.

In the cover 5 with a coolant flow route decided as above, gas accumulation is liable to be generated above the coolant inlet 51h near the corner part (the upper left corner part in FIG. 4A) of the cover 5. A part where gas accumulation is liable to be generated will be referred to as a "gas accumulation part" below.

In the present embodiment, as shown in FIG. 5A, a vertically extending groove 54 is formed on a joint face with the substrate 4 at the corner part near the coolant inlet 51h of the cover 5. An upper end of the groove 54 opens at the gas accumulation part to form an opening 54a, and a lower end of the groove 54 opens near the coolant outlet 52h to form an opening 54b. When the cover 5 formed with such a groove 54 is tightly sealed with the substrate 4, as shown in FIG. 5B, a bypath B connecting from the gas accumulation part to near the coolant outlet 52h is formed.

A section area, length and shape, etc. of the groove 54 (bypath B) are suitably set, so that an air or bubble in a gas accumulation part is discharged through the bypath B.

Note that, in the present embodiment, the bypath B was formed by the groove 54, but the present invention is not limited to this and a bypath may be provided by using a tube member.

When a coolant flows by the flow route decided by the partition walls 53 of the cover 5, a pressure of the coolant lowers due to pressure drop as the coolant flows from upstream to downstream, so that the coolant pressure at the lower end opening 54b of the bypath B becomes lower than that at the upper end opening 54a (gas accumulation part) of the bypath B. Note that a section area of the coolant route at the upper end opening 54a (gas accumulation part) of the bypath B is approximately the same as that at the lower end opening 54b of the bypath B, so that the flow rate of the coolant near the upper end opening 54a (gas accumulation part) of the bypath B and that at the lower end opening 54b of the bypath B are approximately the same. Therefore, an air or bubble remained in the gas accumulation part is discharged to the coolant outlet 52h through the bypath B (from the upper end opening 54a to the lower end opening 54b) due to a pressure difference between the upper end opening 54a of the bypath B and the lower end opening 54b of the bypath B.

According to the cover 5 according to the present embodiment, it is possible to effectively remove gas accumulation to surely cool IC devices 44 mounted on the substrate 4 as explained above without hindering the degree of freedom on designing the coolant flow route.

As a result that gas accumulation can be accurately eliminated as explained above, in an IC device testing apparatus using the above cover 5, a signal propagation delay amount of an internal circuit of the IC device 44 can be kept under a constant condition and timing accuracy of the testing apparatus can be improved. Accordingly, test quality on timing accuracy, etc. of the IC device 44 to be tested can be improved.

Second Embodiment

Next, a heating element cooling cover according to a second embodiment of the present invention will be explained.

Figure 6:
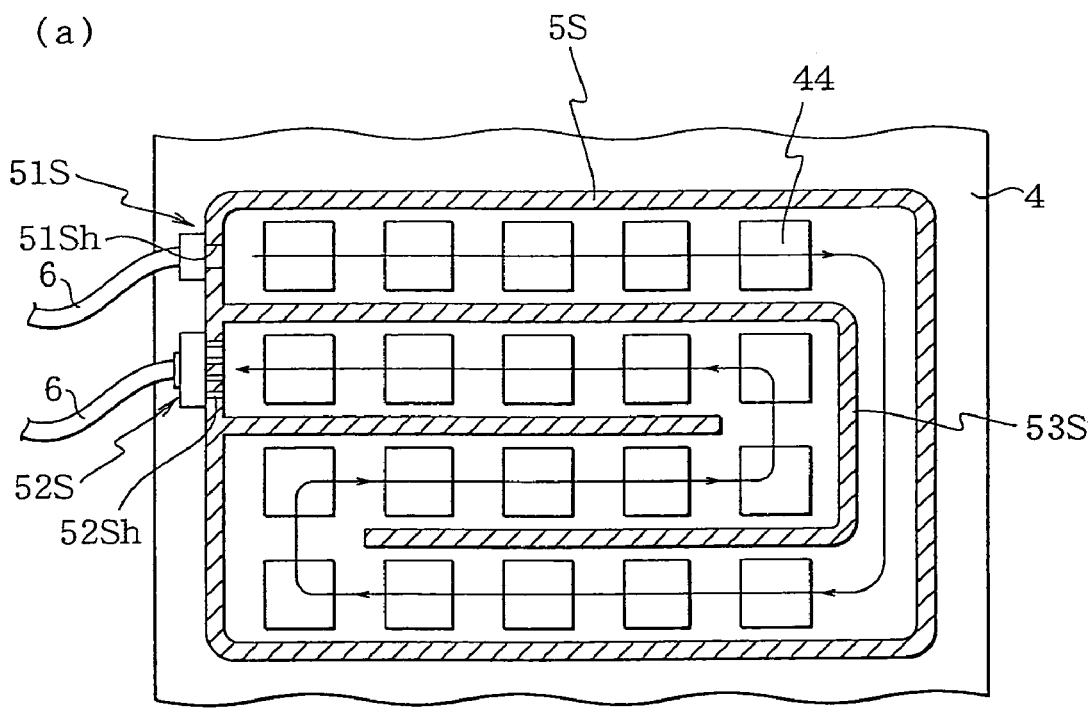
Figure 6:
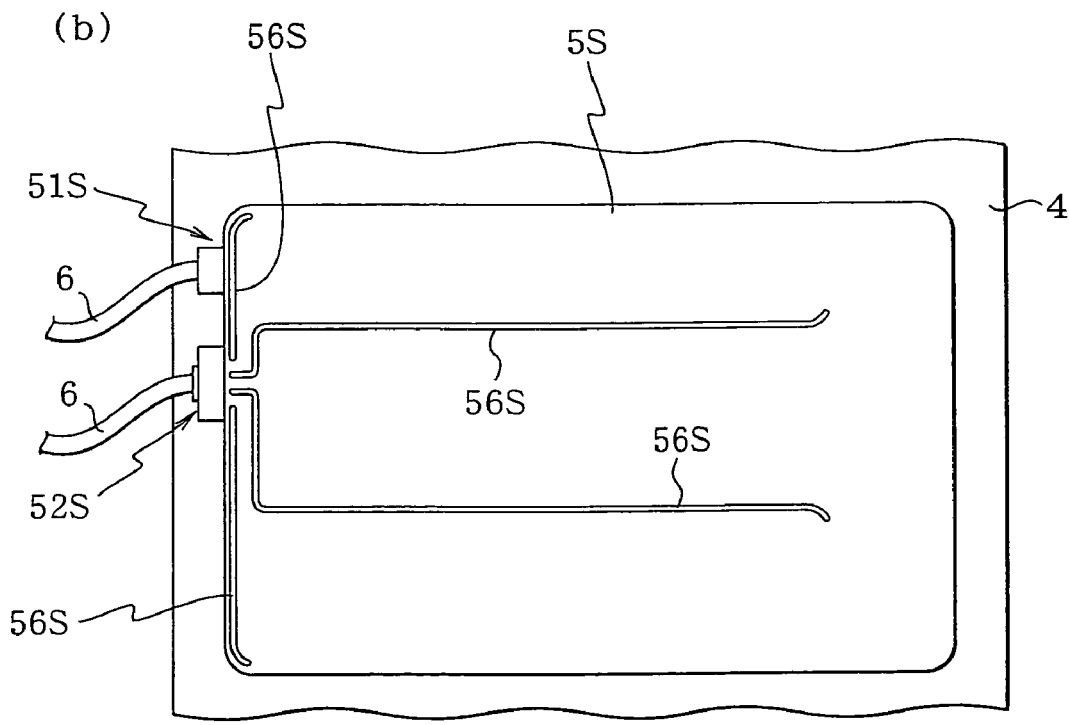

A cover 5S according to the present embodiment is attached to both surfaces of a same substrate 4 as the substrate 4 in the first embodiment to cover IC devices 44 as shown in FIG. 6A in the same way as the cover 5 according to the above first embodiment. Also, one side wall portion of the cover 5S is provided with a coolant inlet portion 51S and a coolant outlet portion 52S, and they are connected to conduits 6, respectively.

As shown in FIG. 6A, a hole as a coolant inlet 51Sh is formed on the coolant inlet portion 51S of the cover 5S, and a hole as a coolant outlet 52Sh is formed on the coolant outlet portion 52S. Note that a section area of the coolant outlet 52Sh is small and four coolant outlets 52Sh are formed in the present embodiment. The section area of the coolant outlet 52Sh is suitably set, so that an air or bubble in a gas accumulation part can be discharged through a later explained bypath tube 56S.

Also, inside the cover 5S, partition walls 53S as shown in FIG. 6A are formed and a flow route of the coolant is decided by the partition walls 53S. The coolant flow route in the cover 5S according to the present embodiment has the same configuration as that of the coolant flow route in the cover 5 according to the first embodiment.

In the cover 5S with a coolant flow route decided as above, above the coolant inlet 51Sh near the corner part (the upper left corner part in FIG. 6A) of the cover 5S becomes a gas accumulation part (first gas accumulation part), but in some cases, near the upper corner of the partition walls 53S (the upper right part in FIG. 6A) positioned on the opposite side of the coolant outlet portion 52S in the coolant flow route for IC devices 44 on the second line may also become a gas accumulation part (second gas accumulation part).

Also when considering the every cases of using the cover 5S (substrate 4) rotated by 90 degrees, 180 degrees or 270 degrees in the longitudinal direction, near the lower corner part (the lower left corner in FIG. 6A) of the cover 5S on the coolant inlet portion 51S/coolant outlet portion 52S in the coolant flow route for the IC devices 44 on the fourth line and near the lower corner part of the partition wall 53S (the lower right corner in FIG. 6A) positioned on the opposite side of the coolant inlet portion 51S/coolant outlet portion 52S in the coolant flow route for IC devices 44 on the third line may also become a gas accumulation part (a third gas accumulation part and fourth gas accumulation part).

The cover 5S according to the present embodiment is provided with four bypath tubes 56S for connecting the first to fourth gas accumulation parts and the four coolant outlets 52Sh as shown in FIG. 6B. A section area, length and shape, etc. of the bypath tubes 56S are suitably set, so that an air or bubble in gas accumulation parts can be discharged through the bypath tubes 56S.

Figure 7:
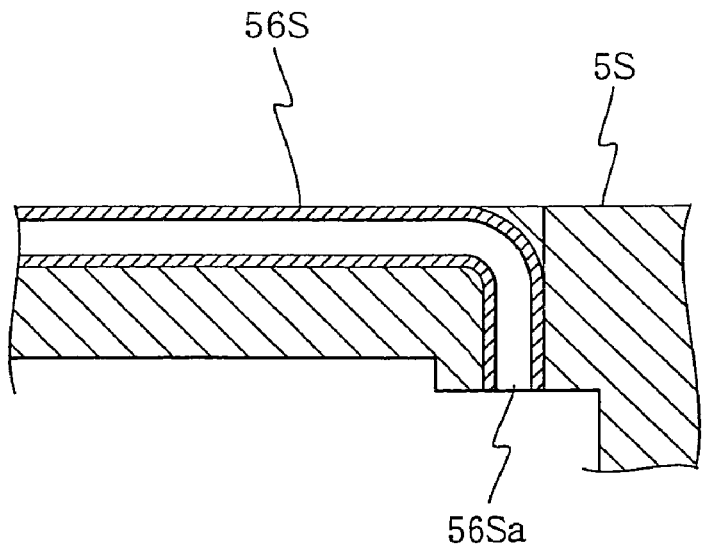
Figure 7:
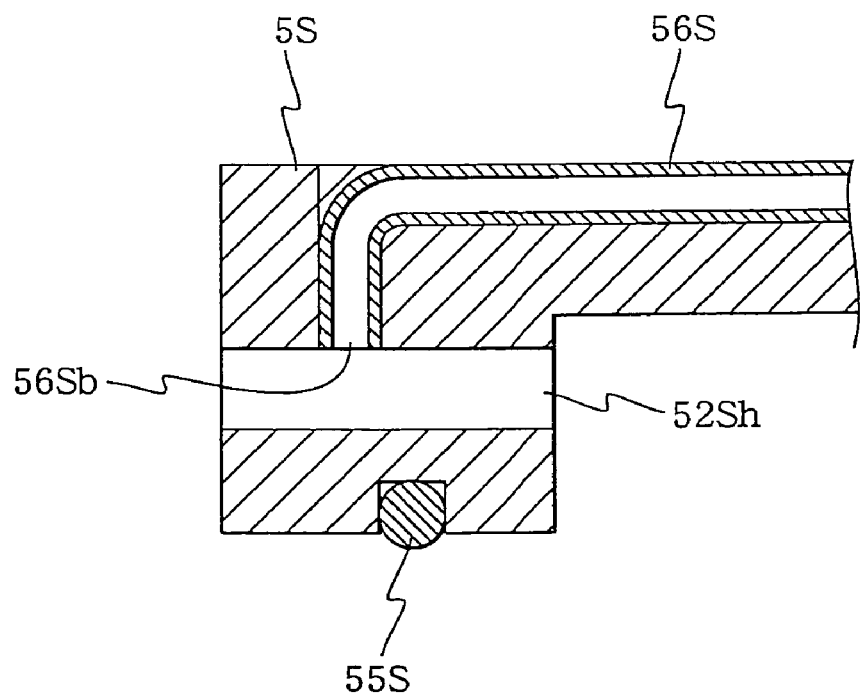

As shown in FIG. 7A, a base end portion of each of the bypath tubes 56S opens at each air accumulation part from the surface side of the cover 5S to form an opening 56Sa as shown in FIG. 7A, and a terminal end portion of each of the bypath tubes 56S opens at each coolant outlet 52Sh from the surface side of the cover 5S to form an opening 56Sb as shown in FIG. 7B.

Note that the bypath tubes 56S in the present embodiment are provided to be buried in the surface portion of the cover 5S, but the present invention is not limited to this and the bypath tubes may be provided to be put on the surface of the cover 5S or inside the cover 5S.

When a coolant flows by the flow route decided by the partition walls 53S of the cover 5S, the flow rate of the coolant at the coolant outlet 52Sh having a small section area becomes high. When the coolant outlet 52Sh with the high coolant flow rate is connected to a terminal end portion of a bypath tube 56S, a pressure at the terminal end portion (opening 56Sb) of the bypath tube 56S becomes lower than that at the base end portion (opening 56Sa) of the bypath tube 56S. An air or bubble remained in a gas accumulation part is discharged from the coolant outlet 52Sh through the bypath tube 56S (from the opening 56Sa to the opening 56Sb) due to the pressure difference.

Note that the coolant outlet 52Sh has a uniform section area in the present embodiment, but an air or bubble remained in the gas accumulation part can be effectively removed by narrowing a middle part to provide a part with a small section area (a throat part) as same as a Venturi tube, etc. and connecting the terminal end portion of the bypath tube 56S thereto.

According to the cover 5S according to the present embodiment, it is possible to effectively remove gas accumulation to surely cool IC devices 44 mounted on the substrate 4 as explained above without hindering the degree of freedom on designing the coolant flow route. Particularly, since the cover 5S according to the present embodiment is capable of removing air accumulation even when used in states of being rotated by 90 degrees, 180 degrees or 270 degrees in the longitudinal direction, the degree of freedom on designing the test head 1 can be improved.

As a result that gas accumulation can be accurately eliminated as explained above, in an IC device testing apparatus using the above cover 5S, a signal propagation delay amount of an internal circuit of the IC device 44 can be kept under a constant condition and timing accuracy of the testing apparatus can be improved. Accordingly, test quality on timing accuracy, etc. of the IC device 44 to be tested can be improved.

The embodiments explained above are for easier understanding of the present invention and not to limit the present invention. Accordingly, respective elements disclosed in the above embodiments include all modifications in designs and equivalents belonging to the technical field of the present invention.

For example, a hole may be formed on a substrate 4 for the coolant to flow back and forth between inside the cover 5, 5S attached on one surface of the substrate 4 and inside the cover 5, 5S attached to the other surface of the substrate 4.

Also, the test head 1 according to the present embodiment may be used for a prover instead of a handler 2.

INDUSTRIAL APPLICABILITY

As explained above, according to a gas collecting device, a test head and an IC device testing apparatus of the present invention, gas accumulation can be effectively removed. Namely, a gas collecting device, a test head and an IC device testing apparatus of the present invention are useful for a device wherein heating elements mounted on a substrate has to be surely cooled.

What is claimed is:

1. A gas collecting device provided with a coolant container for containing a coolant and circulating said coolant to make it contact a heating element, for collecting a gas existing in an internal space of said coolant container, comprising:
    a gas collecting mechanism for drawing the gas existing in the internal space of said coolant container to discharge to outside of said coolant container, wherein
        said gas collecting mechanism is provided with a drawing path,
        one end of said drawing path opens at a gas accumulation part generated in the internal space of said coolant container,
        the other end of said drawing path opens at a discharge portion of the coolant in said coolant container, and
        said drawing path is a bypass formed to be a groove shape on said coolant container.

2. The gas collecting device provided with a coolant container for containing a coolant and circulating said coolant to make it container, comprising:
    a gas collecting mechanism for drawing the gas existing in the internal space of said coolant container to discharge to outside of said coolant container, wherein
        said gas collecting mechanism is provided with a drawing path,
        one end of said drawing path opens at a gas accumulation part generated in the internal space of said coolant container,
        the other end of said drawing path opens at a discharge portion of the coolant in said coolant container,
        said coolant container is arranged to be in a plurality of directions, and positions of said gas accumulation part change along with said plurality of directions, and
        said drawing paths are arranged corresponding to respective positions of said moving gas accumulation part.

3. A test head, having a configuration of circulating said coolant to make it contact the heating element mounted on the substrate, comprising the gas collecting device as set forth in any one of claim 1 or 2.

4. An IC device testing apparatus having the configuration of circulating said coolant to make it contact the heating element mounted on the substrate, comprising the gas collecting device as set forth in any one of claim 1 or 2.

5. A gas collecting device provided with a coolant container for containing a coolant and circulating said coolant to make it contact a heating element, for collecting a gas existing in an internal space of said coolant container, comprising:
    a gas collecting mechanism for drawing the gas existing in the internal space of said coolant container to discharge to outside of said coolant container, wherein
        said heating element is a plurality of heating elements mounted on a substrate; and
        said coolant container is a heating clement cooling cover attached in an airtight way to one surface or both surfaces of said substrate to cover said heating elements.

6. A gas collecting device provided with a coolant container for containing a coolant and circulating said coolant to make it contact a plurality of heating elements, for collecting a gas existing in an internal space of said coolant container, comprising:
    a gas collecting mechanism for drawing the gas existing in the internal space of said coolant container to discharge to outside of said coolant container, wherein
        the plurality of heating elements are arranged on a substrate;
        said coolant container is provided with partition walls; and
        said partition walls are provided to form a flow route for said coolant to flow corresponding to an arrangement of said plurality of heating elements.

7. A test head, having a configuration of circulating said coolant to make it contact the heating elements mounted on the substrate, comprising the gas collecting device as set forth in any one of claim 5 or 6.

8. An IC device testing apparatus having the configuration of circulating said coolant to make it contact the heating elements mounted on the substrate, comprising the gas collecting device as set forth in any one of claim 5 or 6.

* * * * *

UNITED STATES PATENT AND TRADEMARK OFFICE
CERTIFICATE OF CORRECTION

| | |
|---|---|
| PATENT NO. | : 7,072,180 B2 |
| APPLICATION NO. | : 10/974724 |
| DATED | : July 4, 2006 |
| INVENTOR(S) | : Nishiura |

It is certified that error appears in the above-identified patent and that said Letters Patent is hereby corrected as shown below:

Column 9, Line 19 should read

Correct the claims as follows:

1. A gas collecting device provided with a coolant container for containing a coolant and circulating said coolant to make it contact a heating element, for collecting a gas existing in an internal space of said coolant container, comprising:
a gas collecting mechanism for drawing the gas existing in the internal space of said coolant container to discharge to outside of said coolant container, wherein said gas collecting mechanism is provided with a drawing path,
one end of said drawing path opens at a gas accumulation part generated in the internal space of said coolant container,
the other end of said drawing path opens at a discharge portion of the coolant in said coolant container, and said drawing path is a bypath formed to be a groove shape on said coolant container.

Col. 9, Line 36

2. A gas collecting device provided with a coolant container for containing a coolant and circulating said coolant to make it contact a heating element, for collecting a gas existing in an internal space of said coolant container, comprising:
a gas collecting mechanism for drawing the gas existing in the internal space of said coolant container to discharge to outside of said coolant container, wherein said gas collecting mechanism is provided with a drawing path,
one end of said drawing path opens at a gas accumulation part generated in the internal space of said coolant container,
the other end of said drawing path opens at a discharge portion of the coolant in said coolant container, said coolant container is arranged to be in a plurality of directions, and positions of said gas accumulation part change along with said plurality of directions, and said drawing paths are arranged corresponding to respective positions of said moving gas accumulation part.

Col. 10, Line 4

3. A test head, having configuration of circulating said coolant to make it contact the heating element mounted on the substrate, comprising the gas collecting device as set forth in any one of claim 1 or 2.

UNITED STATES PATENT AND TRADEMARK OFFICE
CERTIFICATE OF CORRECTION

PATENT NO.        : 7,072,180 B2
APPLICATION NO. : 10/974724
DATED             : July 4, 2006
INVENTOR(S)       : Nishiura It is certified that error appears in the above-identified patent and that said Letters Patent is hereby corrected as shown below:

Col. 10, Line 8

4. An IC device testing apparatus having the configuration of circulating said coolant to make it contact the heating element mounted on the substrate, comprising the gas collecting device as set forth in any one of claim 1 or 2.

Col. 10, Line 12

5. A gas collecting device provided with a coolant container for containing a coolant and circulating said coolant to make it contact a heating element, for collecting a gas existing in an internal space of said coolant container, comprising;
   a gas collecting mechanism for drawing the gas existing in the internal space of said coolant container to discharge to outside of said coolant container, wherein said heating element is a plurality of heating elements mounted on a substrate;
   and said coolant container is a heating element cooling cover attached in an airtight way to one surface or both surfaces of said substrate to cover said heating elements.

Col. 10, Line 27

6. A gas collecting device provided with a coolant container for containing a coolant and circulating said coolant to make it contact a plurality of heating elements, for collecting a gas existing in an internal space of said coolant container, comprising
   a gas collecting mechanism for drawing the gas existing in the internal space of said coolant container to discharge to outside of said coolant container, wherein
      the plurality of heating elements are arranged on a substrate;
      said coolant container is provided with partition walls; and said partition walls are provided to form a flow route for said coolant to flow corresponding to an arrangement of said plurality of heating elements.

Col. 10, Line 43

7. A test head, having a configuration of circulating said coolant to make it contact the heating element mounted on the substrate, comprising the gas collecting device as set forth in any one of claim 5 or 6.

UNITED STATES PATENT AND TRADEMARK OFFICE
CERTIFICATE OF CORRECTION

| | |
|---|---|
| PATENT NO. | : 7,072,180 B2 |
| APPLICATION NO. | : 10/974724 |
| DATED | : July 4, 2006 |
| INVENTOR(S) | : Nishiura |

It is certified that error appears in the above-identified patent and that said Letters Patent is hereby corrected as shown below:

Col. 10, Line 47

8. An IC device testing apparatus having the configuration of circulating said coolant to make it contact the heating element mounted on the substrate, comprising the gas collecting device as set forth in any one of claim 5 or 6.

Signed and Sealed this

Twenty-seventh Day of November, 2007

JON W. DUDAS
*Director of the United States Patent and Trademark Office*